(12) United States Patent
Hwang et al.

(10) Patent No.: US 8,558,222 B2
(45) Date of Patent: Oct. 15, 2013

(54) ORGANIC LIGHT EMITTING DIODE DISPLAY

(75) Inventors: Kyu-Hwan Hwang, Yongin (KR); Seok-Gyu Yoon, Yongin (KR); Jae-Heung Ha, Yongin (KR); Young-Woo Song, Yongin (KR); Jong-Hyuk Lee, Yongin (KR); Chaun-Gi Choi, Yongin (KR); Sang-Moo Choi, Yongin (KR); Keum-Nam Kim, Yongin (KR); Gun-Shik Kim, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 330 days.

(21) Appl. No.: 12/962,894

(22) Filed: Dec. 8, 2010

(65) Prior Publication Data

US 2011/0147770 A1   Jun. 23, 2011

(30) Foreign Application Priority Data

Dec. 21, 2009   (KR) .......................... 10-2009-0128021

(51) Int. Cl.
*H01L 51/52*   (2006.01)

(52) U.S. Cl.
USPC ........... 257/40; 257/72; 257/89; 257/E51.022

(58) Field of Classification Search
CPC .................................................. H01L 51/5281
USPC .................................................. 257/E51.003
See application file for complete search history.

(56) References Cited

U.S. PATENT DOCUMENTS

| | | | |
|---|---|---|---|
| 5,739,545 A | 4/1998 | Guha et al. | |
| 6,867,822 B2* | 3/2005 | Kim et al. | 349/38 |
| 7,330,231 B2* | 2/2008 | Kim et al. | 349/114 |
| 7,382,384 B2 | 6/2008 | Winters et al. | |
| 7,586,258 B2* | 9/2009 | Li | 313/506 |
| 2005/0212412 A1* | 9/2005 | Kurosawa et al. | 313/504 |
| 2010/0127272 A1* | 5/2010 | Jeong et al. | 257/72 |

FOREIGN PATENT DOCUMENTS

| | | |
|---|---|---|
| CN | 001734331 | 2/2006 |
| DE | 10 2005 057 699 A1 | 5/2007 |
| JP | 2005-129505 A | 5/2005 |
| JP | 2006-128241 A | 5/2006 |
| JP | 2008-112112 A | 5/2008 |
| JP | 2008-523446 A | 7/2008 |
| JP | 2011-129392 A | 6/2011 |
| KR | 10-2003-0024076 | 3/2003 |
| KR | 10 2003-0076288 A | 9/2003 |
| KR | 10-2006-0095494 | 8/2006 |
| KR | 10-2006-0122742 | 11/2006 |
| KR | 10-2007-0059835 | 6/2007 |
| KR | 10 2008-0056944 A | 6/2008 |
| WO | WO 01/99195 A1 | 12/2001 |

* cited by examiner

*Primary Examiner* — Stephen W Smoot
(74) *Attorney, Agent, or Firm* — Lee & Morse, P.C.

(57) ABSTRACT

An organic light emitting diode display includes: a substrate main body having a plurality of pixel regions, each including an opaque region and a transparent region; and organic light emitting diodes, thin film transistors, and conductive lines that are formed in the opaque region of the substrate main body. The transparent region includes a transparent square space that has an area that is at least 15% of the entire area of the pixel region.

25 Claims, 12 Drawing Sheets

ORGANIC LIGHT EMITTING DIODE DISPLAY

CROSS-REFERENCE TO RELATED APPLICATION

This application claims the benefit of Korean Application No. 10-2009-0128021, filed Dec. 21, 2009, in the Korean Intellectual Property Office, the disclosure of which is incorporated herein by reference.

BACKGROUND

1. Field

Exemplary embodiments relate to an organic light emitting diode display, and more particularly, to a transparent organic light emitting diode display.

2. Description of the Related Art

An organic light emitting diode display is a self emissive display that displays an image using an organic light emitting diode for emitting light.

Light is emitted using energy generated when excitons produced by electron-hole combinations in the organic emission layer drop from an excitation state to a ground state. The organic light emitting diode display displays an image using the emitted light.

Moreover, the organic light emitting diode display can be provided as a transparent display device that allows a user to view an object or image located on the opposite side of the organic light emitting diode display owing to the transparency of the display device. For instance, a transparent organic light emitting diode display can transmit light from an object or image located on the opposite side when the transparent organic light emitting diode display is switched off, and can display an image by light emitted from the organic light emitting diode when the transparent organic light emitting diode display is switched on.

Therefore, the transparent organic light emitting diode display is divided into opaque regions where pixels including organic light emitting diodes, thin film transistors, etc. are formed, and a transparent regions through which light from an exterior source located on an opposite side of the transparent organic light emitting diode display is transmitted. The transparent regions, each typically having a width of several to several tens of micrometers, are regularly arranged between the pixels such that when light passes through the transparent regions an object or image located on the opposite side is visible.

However, when the transparent regions are longitudinally formed, that is, with a length much greater than a width, and with a width of several to several tens of micrometers, light is diffracted as it passes through the transparent region. The diffracted light may interfere with light emitted from the organic light emitting diodes and distort an image displayed by the organic light emitting diode display.

Moreover, as the light passing through the transparent region is diffracted, a diffraction pattern may appear, thereby causing a problem of distortion of an object or image located on the opposite side that is viewed through the transparent organic light emitting diode display.

The above information disclosed in this Background section is only for enhancement of understanding of the background of the described technology and therefore it may contain information that does not form the prior art that is already known in this country to a person of ordinary skill in the art.

SUMMARY

Exemplary embodiments provide a transparent organic light emitting diode display that minimizes distortion of an image by suppressing the diffraction of passing light.

According to an exemplary embodiment, an organic light emitting diode display includes: a substrate main body having a plurality of pixel regions, each pixel region including an opaque region and a transparent region; and organic light emitting diodes, thin film transistors, and conductive lines that are formed in the opaque region of the substrate main body. The transparent region includes a transparent square space that has an area that is at least 15% of the entire area of the pixel region.

According to a non-limiting aspect, the transparent region may further include an auxiliary transparent space extending in one or more directions from the transparent square space.

According to a non-limiting aspect, the pixel region may have a segment in which the width of the transparent region is larger than the width of the opaque region.

According to a non-limiting aspect, the ratio of the area of the transparent region to the entire area of the pixel region may fall in the range of 25% to 80%.

According to a non-limiting aspect, the transparent region may have an average overall transmittance of light in the range of 15% to 90%.

According to a non-limiting aspect, the organic light emitting diode display may further include one or more transparent insulating films formed in the transparent region.

According to a non-limiting aspect, the organic light emitting diode display may further include an opaque material formed in a part of the transparent region.

According to a non-limiting aspect, the pixel region may be formed in a square shape.

According to a non-limiting aspect, in the organic light emitting diode display, the opaque region may include a plurality of sub-pixel regions and a line region.

According to a non-limiting aspect, the organic light emitting diodes and the thin film transistors may be formed in the plurality of sub-pixel regions, and the conductive lines may be formed in the line region.

According to a non-limiting aspect, the conductive lines may further include a gate line, a data line, and a common power line.

According to a non-limiting aspect, at least some of the plurality of sub-pixel regions may have different areas from each other.

According to a non-limiting aspect, the plurality of sub-pixel regions may include a first sub-pixel region, a second sub-pixel region, and a third sub-pixel region.

According to a non-limiting aspect, the organic light emitting diode formed in the first sub-pixel region may emit red-based light. The organic light emitting diode formed in the second sub-pixel region may emit green-based light. The organic light emitting diode formed in the third sub-pixel region may emit blue-based light.

According to a non-limiting aspect, the transparent region may be formed in a rectangular shape, and the plurality of sub-pixel regions may be arranged side by side along the longest side in a lengthwise direction of the transparent region.

According to a non-limiting aspect, the second sub-pixel region may be arranged adjacent to one side of the first sub-pixel region, and the third sub-pixel region may be arranged adjacent to another side of the first sub-pixel region that is perpendicular to the one side of the first sub-pixel region that the second sub-pixel region is adjacent to.

According to a non-limiting aspect, the plurality of sub-pixel regions may be formed in a square shape.

According to a non-limiting aspect, the second sub-pixel region and the third sub-pixel region each may have a pair of sides that face the transparent region and are perpendicular to each other.

According to a non-limiting aspect, the plurality of sub-pixel regions may be formed in a rectangular shape.

According to a non-limiting aspect, one long side of the second sub-pixel region may face one long side of the first sub-pixel region, and one short side of the third sub-pixel region may face one short side of the first sub-pixel region. The second sub-pixel region and the third sub-pixel region each may have a pair of sides that face the transparent region and are perpendicular to each other.

According to a non-limiting aspect, one short side of the second sub-pixel region may face one short side of the first sub-pixel region, and one short side of the third sub-pixel region may face one long side of the first sub-pixel region. One long side of the second sub-pixel region, one long side of the third sub-pixel region, and a part of the one long side of the first sub-pixel region may face the transparent region.

According to a non-limiting aspect, the transparent region may be formed in a quadrangular shape.

According to a non-limiting aspect, the first sub-pixel region may be formed in a square shape, and the second sub-pixel region and the third sub-pixel region may be formed in a rectangular shape.

According to a non-limiting aspect, one short side of the second sub-pixel region and one short side of the third sub-pixel may face the first sub-pixel region. One long side of the second sub-pixel region and one long side of the third sub-pixel region may face the transparent region.

According to a non-limiting aspect, one short side of the second sub-pixel region and one short side of the third sub-pixel may be shorter than one side of the first sub-pixel region.

According to exemplary embodiments, an organic light emitting diode display can minimize distortion of an image by suppressing the diffraction of light that passes through the organic light emitting diode display.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION

Figure 1:
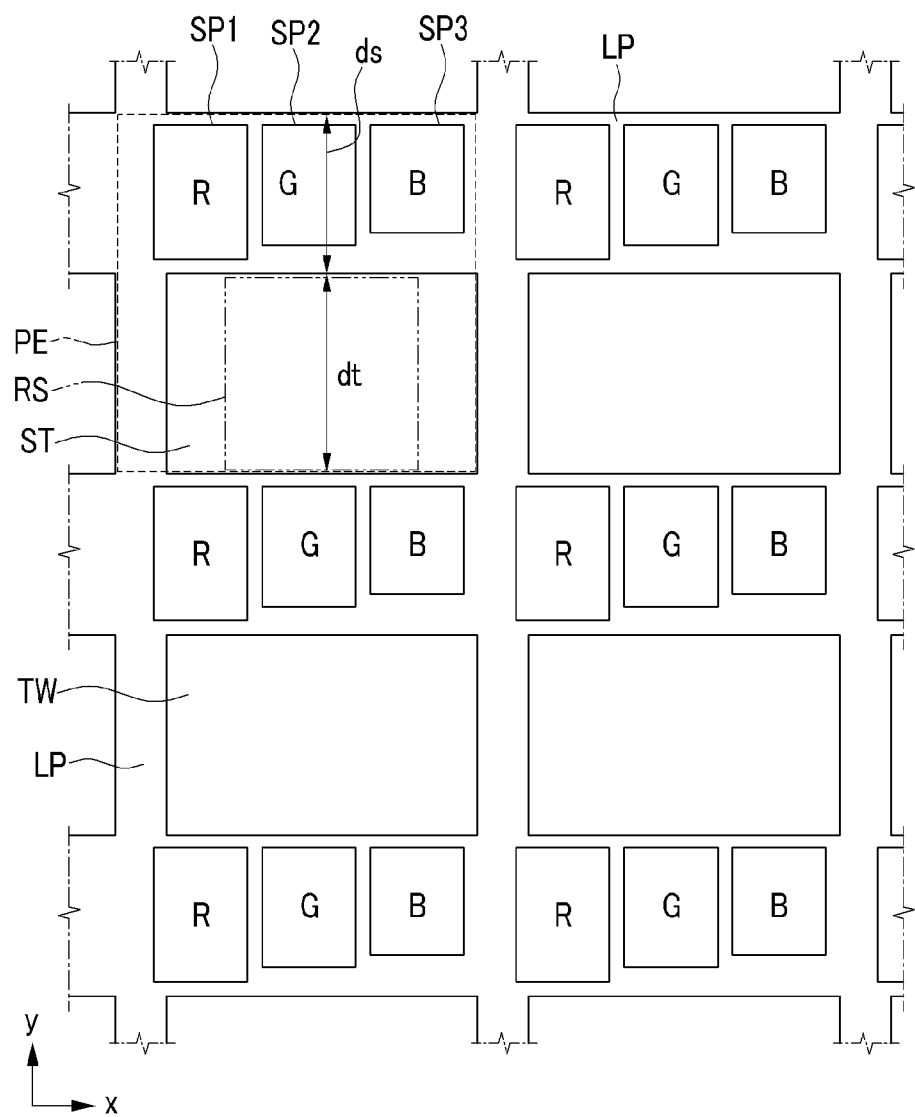
FIG. 1 is a layout view of an organic light emitting diode display according to an exemplary embodiment.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Like reference numerals designate like constituent elements throughout the specification. In various exemplary embodiments other than a first exemplary embodiment, only the elements that are different from those in the first exemplary embodiment are described.

In the drawings, the sizes and thicknesses of the components are merely shown for convenience of explanation, and therefore the exemplary embodiment is not necessarily limited to the illustrations described and shown herein.

In the drawings, the thickness of layers, films, panels, regions, etc., are exaggerated for clarity. In the drawings, the thickness of some of the layers and regions are exaggerated for the convenience of explanation. It will be understood that when an element such as a layer, film, region, or substrate is referred to as being "on" another element, it can be directly on the other element or intervening elements may also be present.

Hereinafter, an organic light emitting diode display 101 according to an exemplary embodiment will be described with reference to FIGS. 1 to 3.

Figure 2:
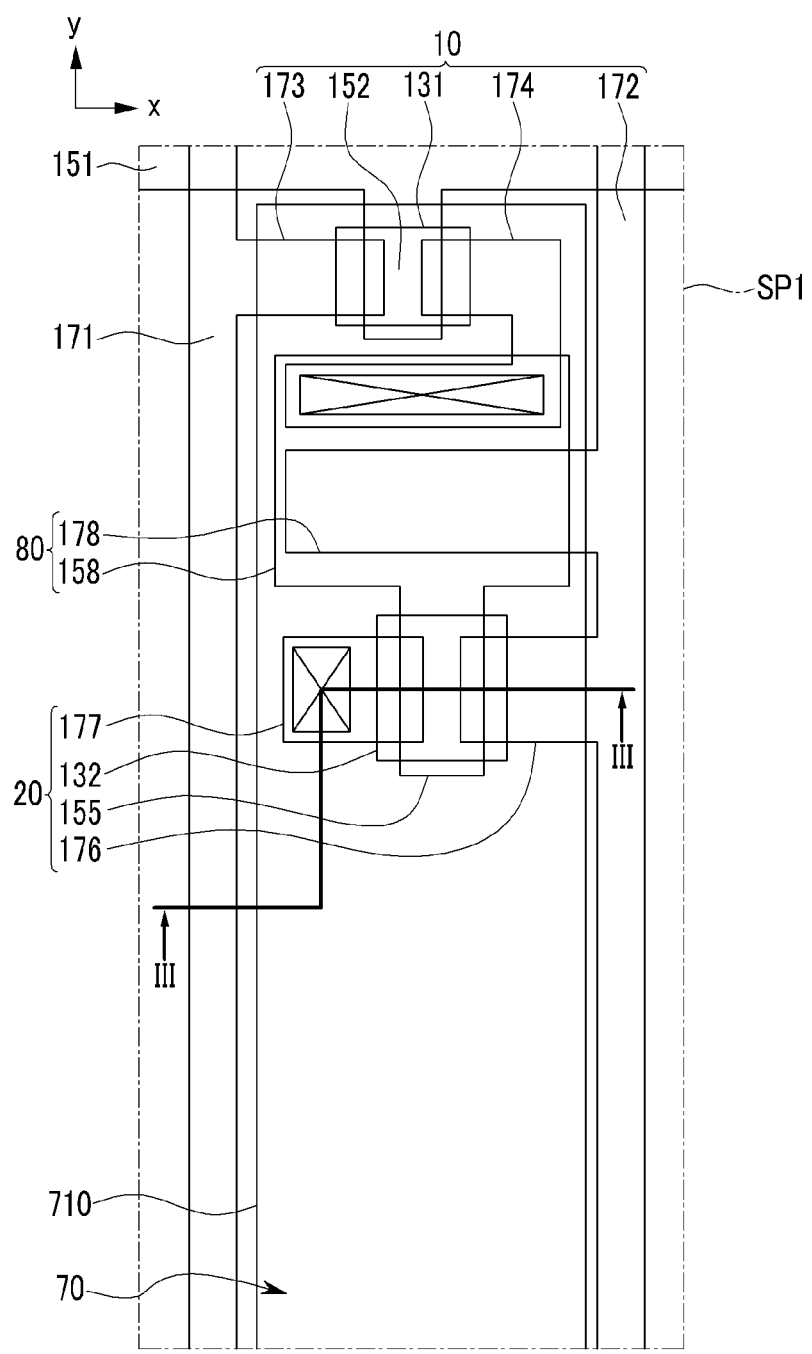
FIG. 2 is an enlarged layout view illustrating a sub-pixel region of FIG. 1.
Figure 3:
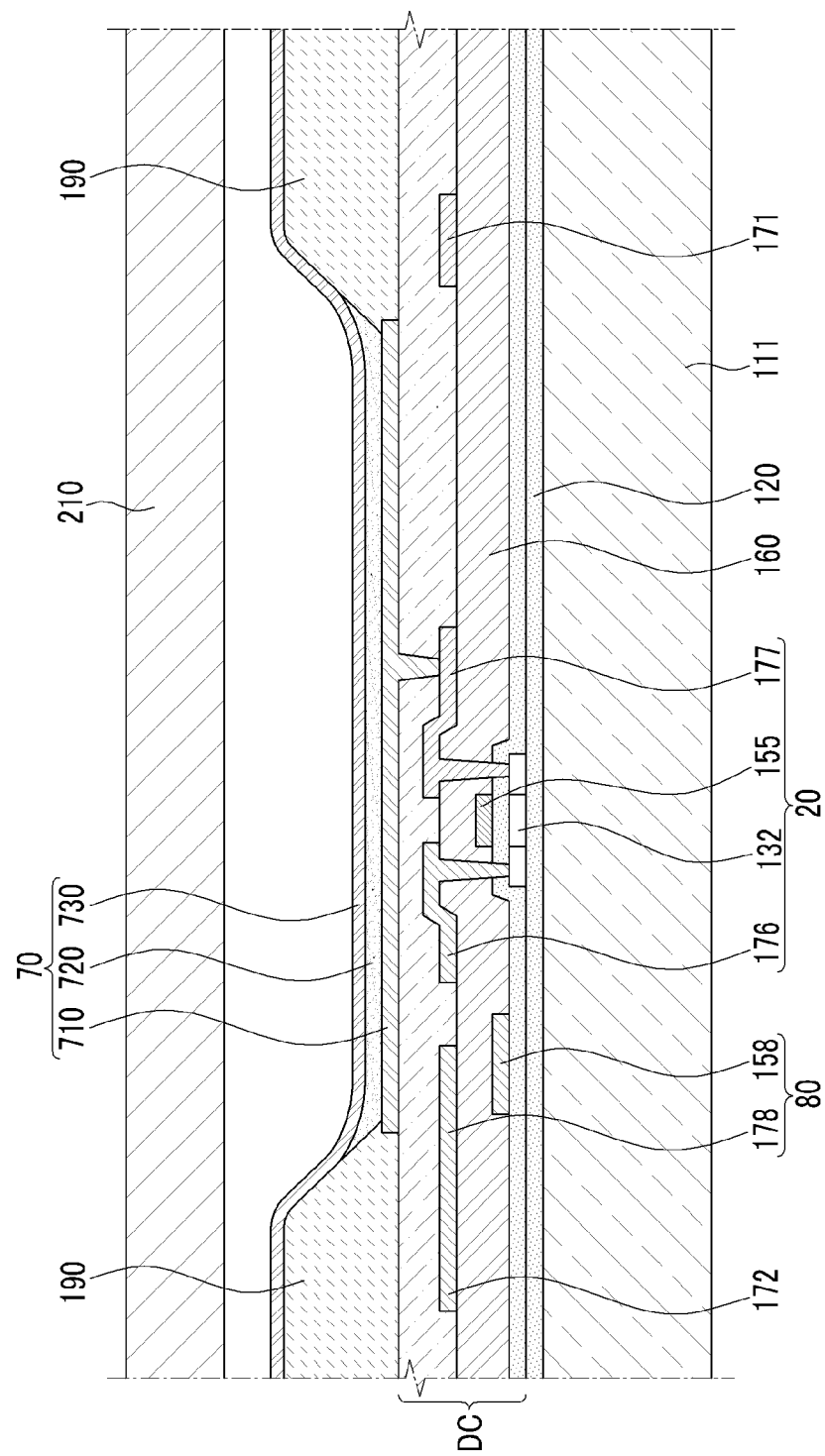
FIG. 3 is a cross-sectional view taken along line III-III of FIG. 2.

As shown in FIGS. 1 to 3, the organic light emitting diode display 101 according to an exemplary embodiment includes a substrate main body 111 having a plurality of pixel regions PE, and organic light emitting diodes (OLEDs) 70 and thin film transistors (TFTs) 10 and 20 that are formed for each of the pixel regions PE of the substrate main body 111. The organic light emitting diode display 101 further includes various conductive lines 151, 171, and 172 that are connected to the thin film transistors 10 and 20 or the organic light emitting diodes 70.

The substrate main body 111 may be formed as a transparent insulating substrate made of glass, quartz, ceramic, plastic, or the like, or may be formed as a flexible substrate made of plastic or the like.

Each pixel region PE may be formed in a square shape. However, the exemplary embodiment is not necessarily limited thereto, and pixel regions PE may be formed in a rectangular shape.

Hereinafter, the terms "square shape" or "rectangular shape" of the pixel region PE, a transparent region TW to be described later, or a plurality of sub-pixel regions SP1, SP2, and SP3 are used loosely and are not meant to be interpreted to require perfect squares or perfect rectangular shape with corners formed at right angles, but refer to an overall square shape or rectangular shape. In other words, regions described as having a square shape or rectangular shape may have rounded corners or other imperfections deviating from a perfect square or perfect rectangle.

The pixel region PE includes opaque regions and a transparent region TW. The opaque region includes a plurality of sub-pixel regions SP1, SP2, and SP3 and a line region LP. As shown in FIG. 2, an organic light emitting diode 70, thin film transistors 10 and 20, and a capacitor 80 are formed for each of the plurality of sub-pixel regions SP1, SP2, and SP3. Conductive lines, such as a gate line 151, a data line 171, and a common power line 172, are formed in the line region LP. Transparent insulating films 120, 160, and 190 (shown in FIG. 3) capable of transmitting light are formed in the transparent region TW.

In the exemplary embodiment of FIG. 1, the plurality of sub-pixel regions include a first sub-pixel region SP1, a second sub-pixel region SP2, and a third sub-pixel region SP3. However, the exemplary embodiment is not limited thereto. Thus, alternatively, a single pixel region PE may include two or four or more sub-pixel regions.

As a non-limiting example, the organic light emitting diode 70 formed in the first sub-pixel region SP1 may red-based light, the organic light emitting diode 70 formed in the second sub-pixel region SP2 may green-based light, and the organic light emitting diode 70 formed in the third sub-pixel region SP3 may emit blue-based light. However, the exemplary embodiment is not limited thereto. As further examples, the organic light emitting diode 70 of the first sub-pixel region SP1 may emit green-based or blue-based light, and the organic light emitting diodes 70 formed in the second sub-pixel region SP2 and the third sub-pixel region SP3 may emit light of colors other than the above colors.

Moreover, at least some of the plurality of sub-pixel regions SP1, SP2, and SP3 may have different areas from each other. That is, all of the sub-pixel regions SP1, SP2, and SP3 may have the same area, all of the sub-pixel regions SP1, SP2, and SP3 may have different areas from each other, or only some of the sub-pixel regions SP1, SP2, and SP3 may have the same area.

In the exemplary embodiment of FIG. 1, the transparent region TW is formed overall in a rectangular shape. The plurality of sub-pixel regions SP1, SP2, and SP3 are arranged side by side along the long-side lengthwise direction (x-axis direction) of the transparent region TW. The plurality of sub-pixel regions SP1, SP2, and SP3 may be formed in a rectangular or square shape.

The transparent region TW includes a transparent square space RS that has an area that is at least 15% of the entire area of the pixel region PE. That is, according to the exemplary embodiment of FIG. 1, the pixel region PE includes a transparent square region having a size that is no less than a minimum of 15% of the entire area of the pixel region PE. The aforementioned transparent square space RS included in the transparent region TW effectively suppresses the diffraction of light passing through the transparent region TW of the pixel region PE.

Light diffraction may occur differently in different directions according to the shape of a transparent region. For example, in a rectangular transparent region, light diffraction may hardly occur in the X-axis direction while light diffraction may occur in the y-axis direction, or vice versa.

However, as in the exemplary embodiment of FIG. 1, if the transparent region TW includes a transparent square space RS having an area that at least 15% of the entire area of the pixel region PE, deviations in diffraction depending on the axis direction may be reduced. That is, if the transparent region TW through which light passes includes a transparent square space RS having an area greater than a minimum amount, relative to the area of the entire pixel region PE, deviations in diffraction depending on the axis direction may be reduced.

Furthermore, the transparent region TW may further include an auxiliary transparent space ST extending in one or more directions from the transparent square space RS. In the exemplary embodiment of FIG. 1, the auxiliary transparent space ST extends in the x-axis direction from the transparent square space RS.

Moreover, the pixel region PE includes a segment in which the width dt of the transparent region TW is larger than the width ds of the opaque region (made up of regions SP1, SP2, SP3, and LP). The ratio of the area of the transparent region TW to the entire area of the pixel region PE may fall within the range of 25% to 80%.

The one or more transparent insulating films 120, 160, and 190 (shown in FIG. 3) formed in the transparent region TW typically do not have a light transmittance of 100%. As a non-limiting example, the transparent insulating films 120, 160, and 190 disposed in the transparent region TW may have a light transmittance of approximately 30% to 95%. In addition, an opaque material may be additionally disposed in a part of the transparent region TW. The opaque material may be a part of the conductive lines 151, 171, and 172, or may be various opaque materials that are disposed as required. As above, the transparent region TW does not only have completely transparent materials disposed therein. Specifically, in the exemplary embodiment of FIG. 1, the transparent region TW may have an average overall transmittance of light in the range of 15% to 90%. If the transparent region TW has an average overall transmittance of less than 15%, it is hard for the organic light emitting diode display 101 to function as a transparent display device. On the other hand, manufacturing is not easy to provide an overall transmittance of an average of more than 90% for the transparent region TW.

With the above-described configuration, the organic light emitting diode display 101 according to the exemplary embodiment of FIG. 1 can minimize the distortion of an image located on an opposite side of the organic light emitting diode display 101 from a viewer or an image formed by light emitted from the organic light emitting diode display 101 by suppressing the diffraction of light that passes through the organic light emitting diode display 101. That is, it is possible to minimize the distortion of a displayed image emitted from the organic light emitting diode 70 and of an object or image located on the opposite side that becomes visible as light passes through the organic light emitting diode display 101.

If the transparent region TW fails to provide a transparent square space RS having an area that is at least 15% of the entire area of the pixel region PE, light is easily diffracted as it passes through the transparent region TW of the pixel region PE. Moreover, in order to suppress the diffraction of light more effectively, the pixel region PE may have a segment in which the width dt of the transparent region TW is larger than the width ds of the opaque region (made up of regions SP1, SP2, SP3, and LP).

Further, if the overall area of the transparent region TW is too small, that is, if the ratio of the area occupied by the transparent region TW to the entire area of the pixel region PE is less than 25%, the amount of light passing through the organic light emitting diode display 101 decreases, such that an object or image located on the opposite side of the organic light emitting diode display 101 may not be viewed effectively. On the other hand, if the area of the transparent region TW is too large, that is, if the ratio of the area occupied by the transparent region TW to the entire area of the pixel region PE is greater than 80%, the area of the opaque region including the sub-pixel regions SP1, SP2, and SP3 and the line region LP becomes narrower, and the organic light emitting diode 70 may not have a sufficient size. Therefore, the quality of the image displayed by the organic light emitting diode display 101 may be severely degraded.

Hereinafter, the internal structure of the organic light emitting diode display 101 will be described in detail with reference to FIGS. 2 and 3. Although FIGS. 2 and 3 illustrate an active matrix (AM) organic light emitting diode display 101 having a 2Tr-1Cap structure in which one pixel includes two thin film transistors 10 and 20 and one capacitor 80, the first exemplary embodiment is not limited thereto. As non-limiting examples, one pixel of the organic light emitting diode display 101 may have three or more thin film transistors and two or more capacitors, and may have various structures by further including additional wires. As used herein, the term "pixel" refers to the smallest unit used in displaying an image. A pixel is disposed in each of pixel regions such that the organic light emitting diode display 101 displays an image through a plurality of pixels.

As shown in FIGS. 2 and 3, a switching thin film transistor 10, a driving thin film transistor 20, a capacitor 80, and an organic light emitting diode 70 are formed for each pixel on the substrate main body 111. A component that includes the switching thin film transistor 10, the driving thin film transistor 20, and the capacitor 80 is referred to as a "driving circuit DC." A buffer layer 120 may be further formed between the substrate main body 111 and the driving circuit DC and organic light emitting diode 70. The buffer layer 120 may have a single-layer structure of silicon nitride ($SiN_x$) or a dual-layer structure of silicon nitride ($SiN_x$) and silicon oxide ($SiO_2$). The buffer layer 120 may prevent the penetration of undesired elements, such as impurity atoms or moisture, and provides a planarized surface. However, the buffer layer 120 is not necessarily required, and may be omitted according to the type and process conditions of the substrate main body 111.

Moreover, a gate line 151 arranged along one direction, a data line 171 insulated from and crossing the gate line 151, and a common power line 172 are further formed on the substrate main body 111.

A single pixel may be defined by the gate line 151, the data line 171, and the common power line 172 as boundaries, but the exemplary embodiment is not necessarily limited thereto.

The organic light emitting diode 70 includes a first electrode 710, an organic emission layer 720 formed on the first electrode 710, and a second electrode 730 formed on the organic emission layer 720. Holes and electrons are injected into the organic emission layer 720 from the first electrode 710 and the second electrode 730, respectively. When excitons formed by the recombination of the injected holes and electrons drop from an excited state to a ground state, light is emitted.

The capacitor 80 includes a pair of capacitor plates 158 and 178 disposed with an interlayer insulating layer 160, which is a dielectric material, interposed therebetween. The storage capacity of the capacitor 80 is determined by the electric charges stored in the capacitor 80 and the voltage between the capacitor plates 158 and 178.

The switching thin film transistor 10 includes a switching semiconductor layer 131, a switching gate electrode 152, a switching source electrode 173, and a switching drain electrode 174. The driving thin film transistor 20 includes a driving semiconductor layer 132, a driving gate electrode 155, a driving source electrode 176, and a driving drain electrode 177.

The switching thin film transistor 10 is used as a switching element to select a pixel to emit light. The switching gate electrode 152 is connected to the gate line 151. The switching source electrode 173 is connected to the data line 171. The switching drain electrode 174 is spaced apart from the switching source electrode 173 and connected to one of the capacitor plates 158.

The driving thin film transistor 20 applies a driving power to the pixel electrode 710 to emit light from the organic emission layer 720 of the organic light emitting diode 300 in the selected pixel. The driving gate electrode 155 is connected to the capacitor plate 158 connected to the switching drain electrode 174. The driving source electrode 176 and the other capacitor plate 178 are connected to the common power line 172. The drain electrode 177 is connected to the pixel electrode 710 of the organic light emitting diode 70 via contact holes.

With the above-described structure, the switching thin film transistor 10 is driven by a gate voltage applied to the gate line 151, and supplies a data voltage applied to the data line 171 to the driving thin film transistor 20. A voltage corresponding to the difference between the common voltage, which is supplied from the common power line 172 to the driving thin film transistor 20, and the data voltage, which is supplied from the switching thin film transistor 10, is stored in the capacitor 80. A current corresponding to the voltage stored in the capacitor 80 flows into the organic light emitting diode 70 through the driving thin film transistor 20 to cause the organic light emitting diode 70 to emit light.

An encapsulation member 210 is disposed on the organic light emitting diode 70. The encapsulation member 210 is bonded to the substrate main body 111 by a sealant (not shown) to seal the internal space thereof, and protects the organic light emitting diode 70 and the thin film transistors 10 and 20. In the first exemplary embodiment, the encapsulating member 210 may be a transparent insulating substrate, such as a glass substrate or a plastic substrate. However, the first exemplary embodiment is not limited thereto. Therefore, a transparent encapsulation thin film including a plurality of protective films that are sequentially laminated may be formed.

Moreover, the structure of the thin film transistors 10 and 20 and the organic light emitting diode 70 is not limited to the structure shown in FIGS. 2 and 3. That is, the structure of the thin film transistors 10 and 20 and the organic light emitting diode 70 may be modified within the scope in which a person skilled in the art may easily implement the exemplary embodiment. Moreover, it is to be understood that the structures described in FIGS. 2 and 3 or other structures of the thin film transistors 10 and 20 and the organic light emitting diode 70 may be used with any embodiment of an organic light emitting diode display, including of the exemplary embodiments described herein.

Hereinafter, an organic light emitting diode display 102 according to another exemplary embodiment will be described with reference to FIG. 4 and compared with the organic light emitting diode display 101 according to the FIG. 1.

Figure 4:
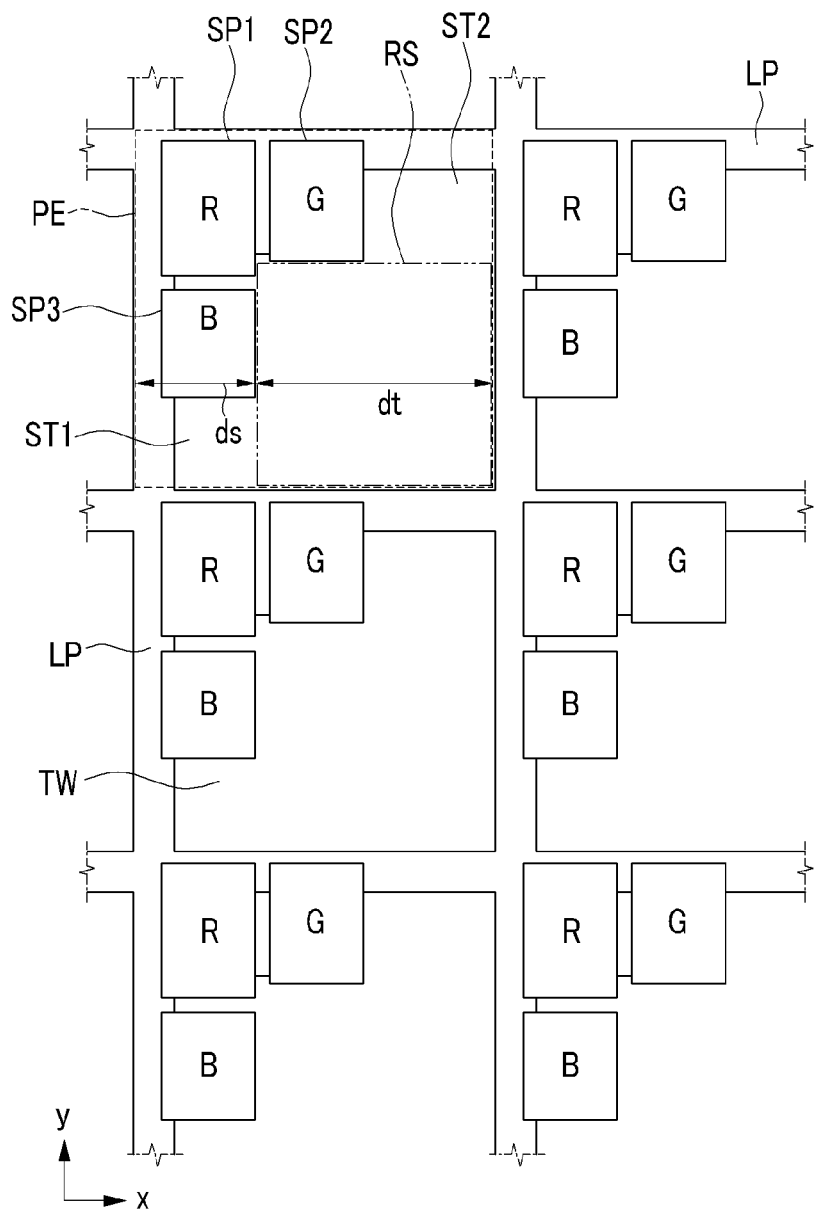
FIG. 4 is a layout view of an organic light emitting diode display according to another exemplary embodiment.

The organic light emitting diode display 102 according to the exemplary embodiment of FIG. 4 includes a first sub-pixel region SP1, a second sub-pixel region SP2 arranged adjacent to one side of the first sub-pixel region SP1, and a third sub-pixel region SP3 arranged adjacent to another side of the first sub-pixel region SP1. Here, the two sides of the first sub-pixel region SP1 are perpendicular to each other. Each of the plurality of sub-pixel regions SP1, SP2, and SP3 is formed in a rectangular shape. Specifically, one long side of the second sub-pixel region SP2 faces one long side of the first sub-pixel region SP1, and one short side of the third sub-pixel region SP3 faces one short side of the first sub-pixel region SP1. Moreover, the second sub-pixel region SP2 and the third sub-pixel region SP3 each have a pair of sides that face the transparent region TW and are perpendicular to each other. Therefore, the transparent region TW includes a stepwise shape.

Further, like the exemplary embodiment of FIG. 1, the transparent region TW includes a transparent square space RS. The transparent square space RS has an area that is at least 15% of the entire area of a pixel region PE.

In the exemplary embodiment of FIG. 1 described earlier, the entire transparent region TW is formed overall in a rectangular shape. Therefore, even if the transparent region TW includes a transparent square space RS, deviations in light diffraction depending on the axis direction may occur to some degree.

On the other hand, in the exemplary embodiment of FIG. 4, in addition to the transparent square space RS, the transparent region TW has auxiliary transparent spaces ST1 and ST2, respectively, which extend in x-axis and y-axis directions from the transparent square space RS. With the above-described structure according to the exemplary embodiment of FIG. 4, even if a part of light passing through the transparent region TW is diffracted, though weakly, while light diffraction is suppressed overall, this diffraction occurs similarly in the x-axis and y-axis directions, thereby further minimizing deviations in diffraction between the two directions.

The pixel region PE has a segment in which a width dt of the transparent region TW is larger than the width ds of an opaque region (made up of regions SP1, SP2, SP3, and LP). The ratio of the area of the transparent region TW to the entire area of the pixel region PE falls in the range of 25% to 80%.

With the above-described configuration, the organic light emitting diode display 102 according to FIG. 4 can effectively suppress the diffraction of light passing through the organic light emitting diode display and further reduce deviations in diffraction.

Hereinafter, an organic light emitting diode display 103 according to another exemplary embodiment will be described with reference to FIG. 5.

Figure 5:
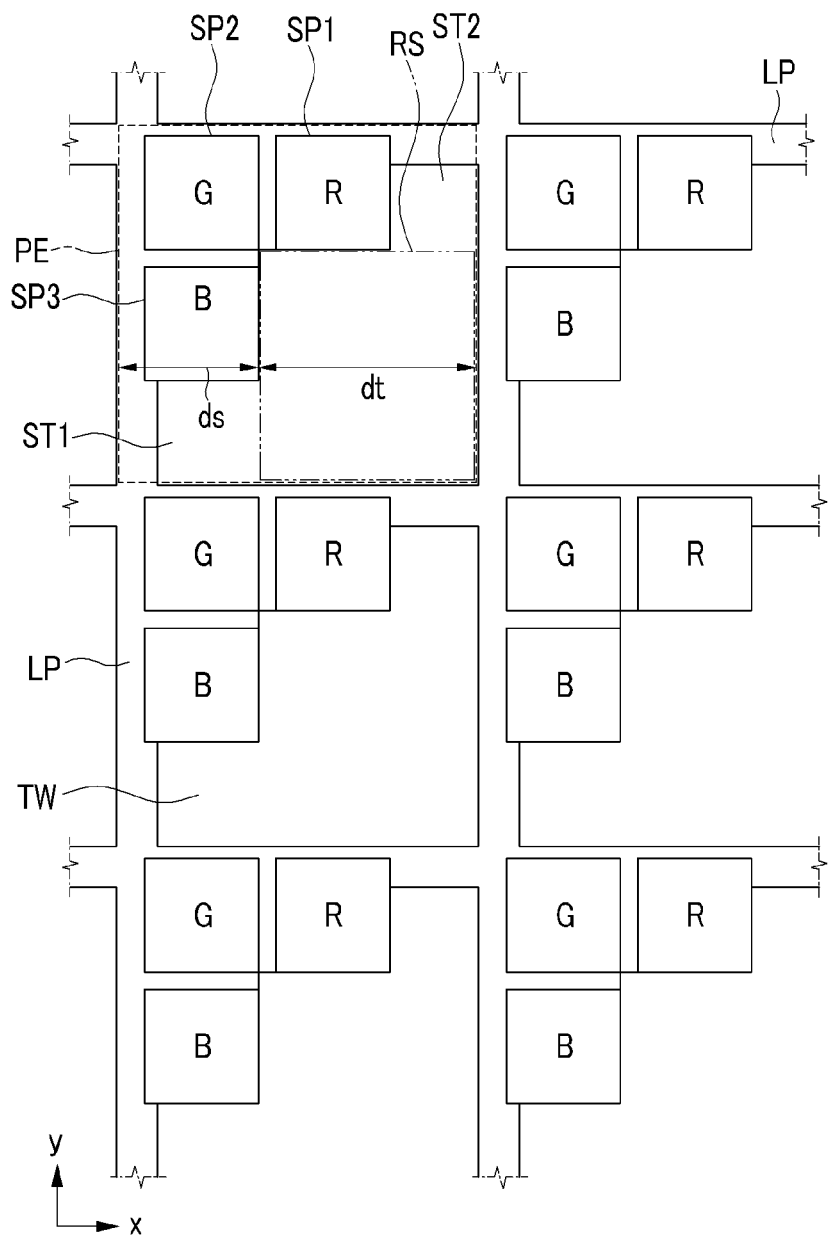
FIG. 5 is a layout view of an organic light emitting diode display according to another exemplary embodiment.

The organic light emitting diode display 103 according to the exemplary embodiment of FIG. 5 includes a first sub-pixel region SP1, a second sub-pixel region SP2 arranged adjacent to one side of the first sub-pixel region SP1, and a third sub-pixel region SP3 arranged adjacent to another side of the first sub-pixel region SP1. Here, the two sides of the first sub-pixel region SP1 are perpendicular to each other. All of the plurality of sub-pixel regions SP1, SP2, and SP3 are formed in a square shape. Moreover, the second sub-pixel region SP2 and the third sub-pixel region SP3 each have a pair of sides that face the transparent region TW and are perpendicular to each other. Therefore, the transparent region TW includes a stepwise shape.

Further, like the exemplary embodiment of FIG. 1, the transparent region TW includes a transparent square space RS that has an area that is at least 15% of the entire area of a pixel region PE.

In the exemplary embodiment of FIG. 5, the plurality of sub-pixel regions SP1, SP2, and SP3 are formed in a square shape. Thus, in addition to the transparent square space RS, the transparent region TW has auxiliary transparent spaces ST1 and ST2 that respectively extend in x-axis and y-axis directions from the transparent square space RS and have a similar area. Therefore, diffractions arising in the x-axis and y-axis directions occur in a more similar fashion, thereby almost eliminating deviations in diffraction between the two directions.

The pixel region PE has a segment in which the width dt of the transparent region TW is larger than the width ds of an opaque region (made up of regions SP1, SP2, SP3, and LP). The ratio of the area of the transparent region TW to the entire area of the pixel region PE falls in the range of 25% to 80%.

With the above-described configuration, the organic light emitting diode display 103 according to the exemplary embodiment of FIG. 5 can effectively suppress the diffraction of light passing through the organic light emitting diode display 103 and further reduce deviations in diffraction.

Hereinafter, an organic light emitting diode display 104 according to another exemplary embodiment will be described with reference to FIG. 6.

Figure 6:
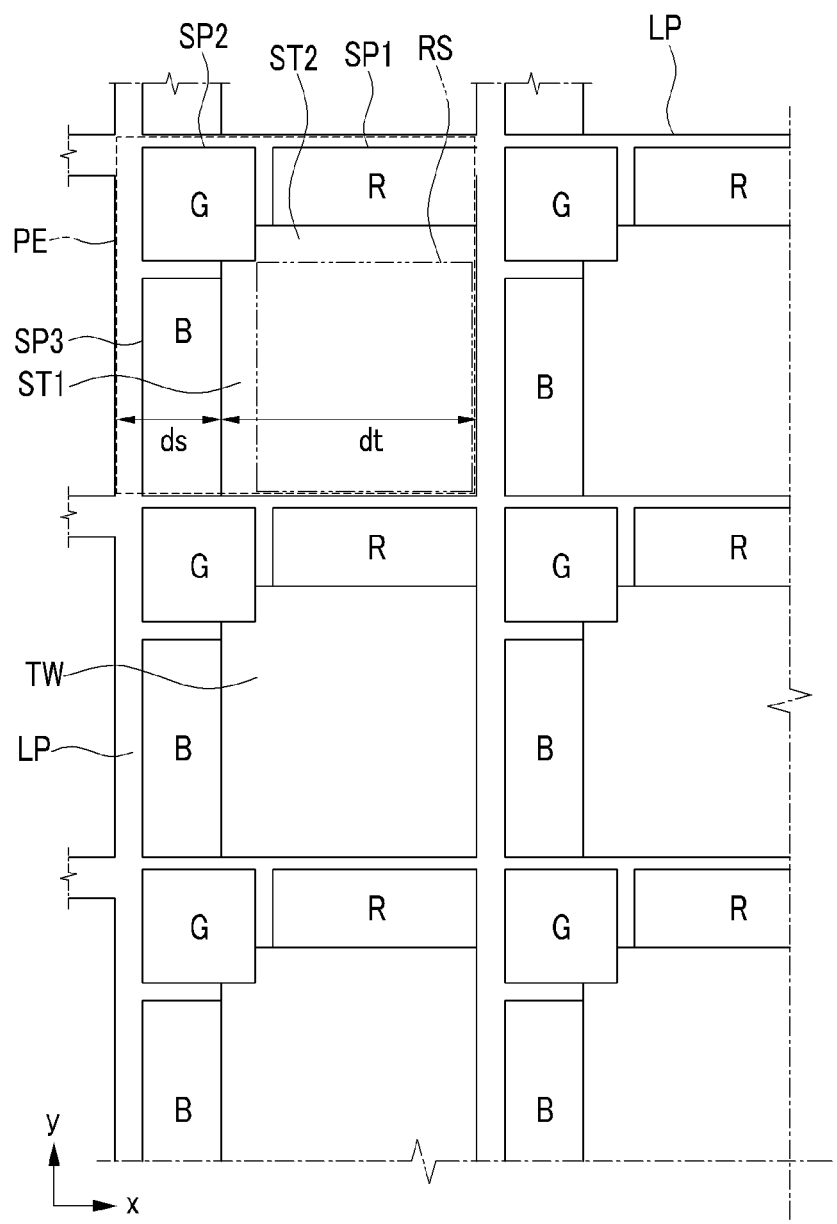
FIG. 6 is a layout view of an organic light emitting diode display according to another exemplary embodiment.

The organic light emitting diode display 104 according to the f exemplary embodiment of FIG. 6 includes a first sub-pixel region SP1, a second sub-pixel region SP2 arranged adjacent to one side of the first sub-pixel region SP1, and a third sub-pixel region SP3 arranged adjacent to another side of the first sub-pixel region SP1. Here, two sides of the first sub-pixel region SP1 are perpendicular to each other. The first sub-pixel regions SP1 is formed in a square shape, and the second sub-pixel SP2 and the third sub-pixel region SP3 are formed in a rectangular shape. Specifically, one short side of the second sub-pixel region SP2 and one short side of the third sub-pixel region SP3 face the first sub-pixel region SP1. The one short side of the second sub-pixel region SP2 and the one short side of the third sub-pixel region SP3 are shorter than corresponding side of the first sub-pixel region SP1. One long side of the second sub-pixel region SP2 and one long side of the third sub-pixel region SP3 face the transparent region TW.

Further, like the exemplary embodiment of FIG. 1, the transparent region TW includes a transparent square space RS that has an area that is at least 15% of the entire area of a pixel region PE.

Moreover, in the exemplary embodiment of FIG. 6 as well, in addition to the transparent square space RS, the transparent region TW has auxiliary transparent spaces ST1 and ST2 that respectively extend in x-axis and y-axis directions from the transparent square space RS and have a similar area. Also, the transparent square space RS occupies most of the transparent region TW. Therefore, diffractions occur almost equally in the x-axis and y-axis directions, thereby almost eliminating deviations in diffraction between the two directions.

The pixel region PE has a segment in which the width dt of the transparent region TW is larger than the width ds of an opaque region (made up of SP1, SP2, SP3, and LP). The ratio of the area of the transparent region TW to the entire area of the pixel region PE falls in the range of 25% to 80%.

With the above-described configuration, the organic light emitting diode display 104 according to the exemplary embodiment of FIG. 6 can effectively suppress the diffraction of light passing through the organic light emitting diode display 104 and further reduce deviations in diffraction.

In addition, the transparent square space RS of the transparent region TW can be formed to be relatively large, thus further suppressing light diffraction.

Hereinafter, an organic light emitting diode display 105 according to another exemplary embodiment will be described with reference to FIG. 7.

Figure 7:
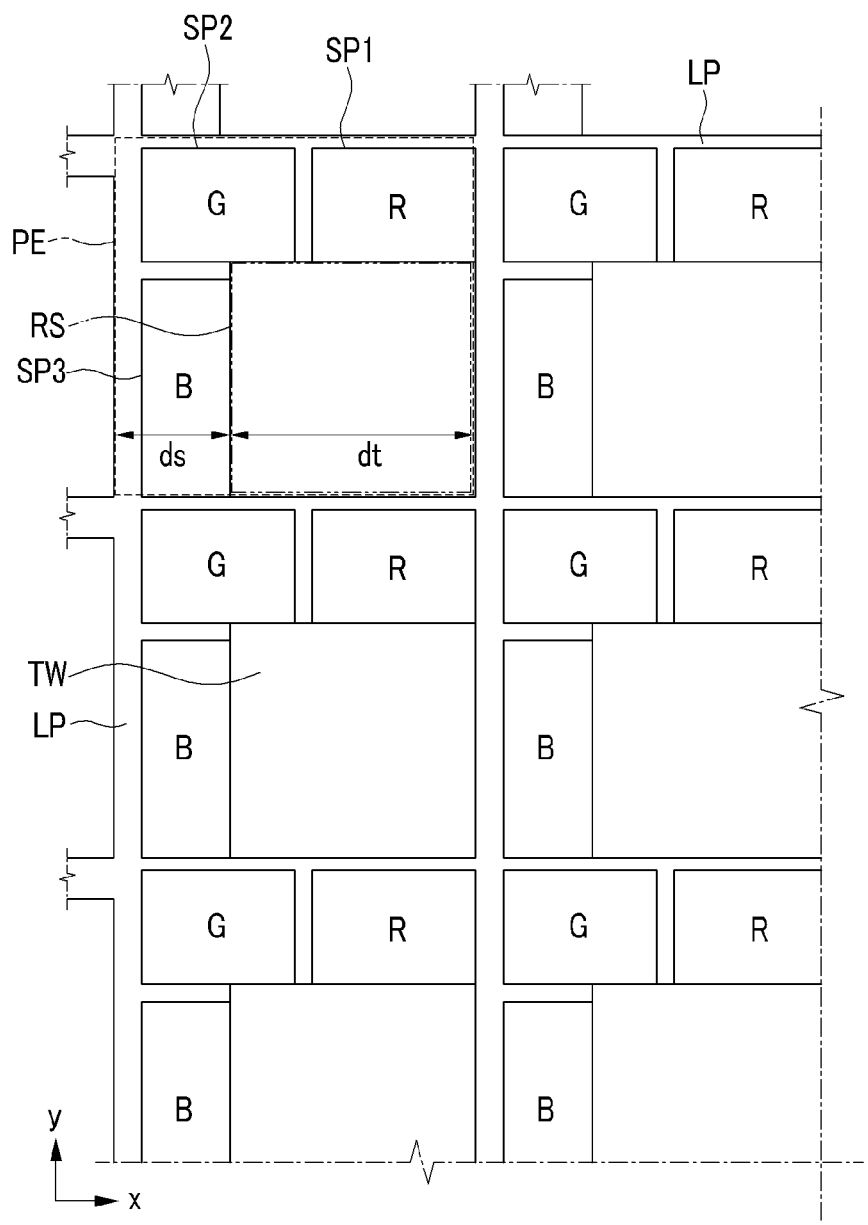
FIG. 7 is a layout view of an organic light emitting diode display according to another exemplary embodiment.

The organic light emitting diode display 105 according to the exemplary embodiment of FIG. 7 includes a first sub-pixel region SP1, a second sub-pixel region SP2 arranged adjacent to one side of the first sub-pixel region SP1, and a third sub-pixel region SP3 arranged adjacent to another side of the first sub-pixel region SP1. Here, the first sub-pixel region SP1 has a rectangular shape, with the longest side extending in a direction that is perpendicular to the side that is adjacent to the second sub-pixel region SP2. While the plurality of sub-pixel regions SP1, SP2, and SP3 are formed in a rectangular shape, the second sub-pixel region SP2 extends in the same lengthwise direction as the first sub-pixel region SP1 and the third sub-pixel region SP3 extends in the lengthwise direction perpendicular to the first sub-pixel region SP1. Specifically, one short side of the second sub-pixel region SP2 faces one short side of the first sub-pixel region SP1, and one short side of the third sub-pixel region SP3 faces one long side of the first sub-pixel region SP1. One long side of the second sub-pixel region SP2, one long side of the third sub-pixel region SP3, and a part of the one long side of the first sub-pixel region SP1 face the transparent region TW. Therefore, the transparent region TW may be formed in a rectangular or square shape. The shape of the transparent region TW according to the exemplary embodiment of FIG. 7 is closer to a square rather than the rectangular shape of the transparent region TW according to the exemplary embodiment of FIG. 1.

Further, like the exemplary embodiment of FIG. 1, the transparent region TW includes a transparent square space RS that has an area that is at least 15% of the entire area of a pixel region PE. Specifically, in the exemplary embodiment of FIG. 7, the transparent square space RS of the transparent region TW is substantially equivalent to the entire transparent region TW. That is, in the exemplary embodiment of FIG. 7, the transparent square space RS can be made the largest as compared to the foregoing exemplary embodiments.

The pixel region PE has a segment in which the width dt of the transparent region TW is larger than the width ds of an opaque region (made up of regions SP1, SP2, SP3, and LP). The ratio of the area of the transparent region TW to the entire area of the pixel region PE falls in the range of 25% to 80%.

With the above-described configuration, the organic light emitting diode display 105 according to the exemplary embodiment of FIG. 7 can most effectively suppress the diffraction of light passing through the organic light emitting diode display 105 and further reduce deviations in diffraction depending on an axis direction Hereinafter, experimental results according to the exemplary embodiments will be described with reference to FIGS. 8 to 17. In each exemplary embodiment, deviations in diffraction are measured by the distortion of an image using a white light source for a concentric circle pattern, which is disposed at intervals of 1 meter behind each of the organic light emitting diode displays 101, 102, 103, 104, 105, which have the transparent region TW.

Figure 8:
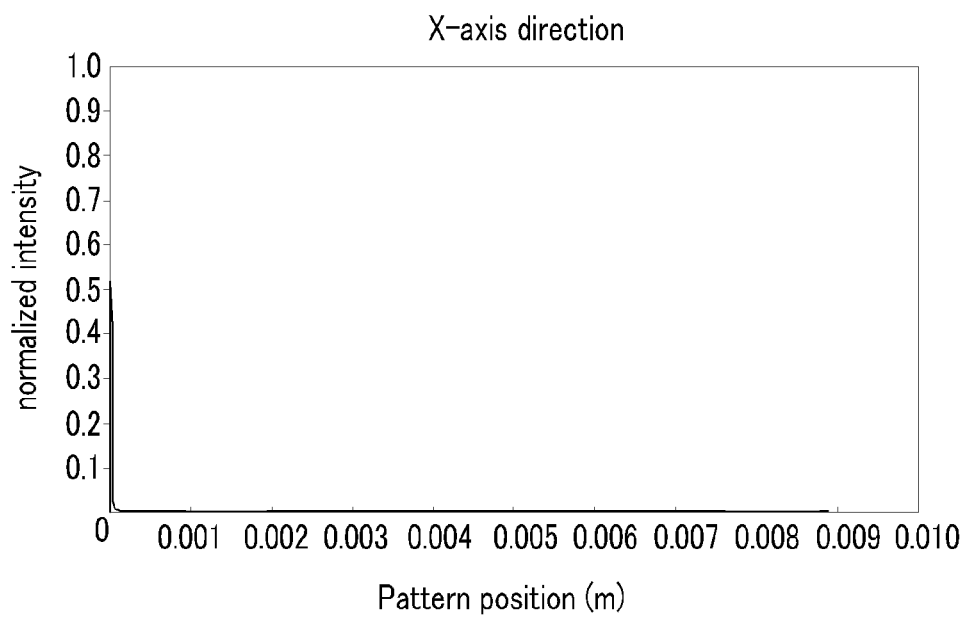
FIGS. 8 to 9 are graphs showing light diffraction experimental results with respect to the exemplary embodiment of FIG. 1.
Figure 9:
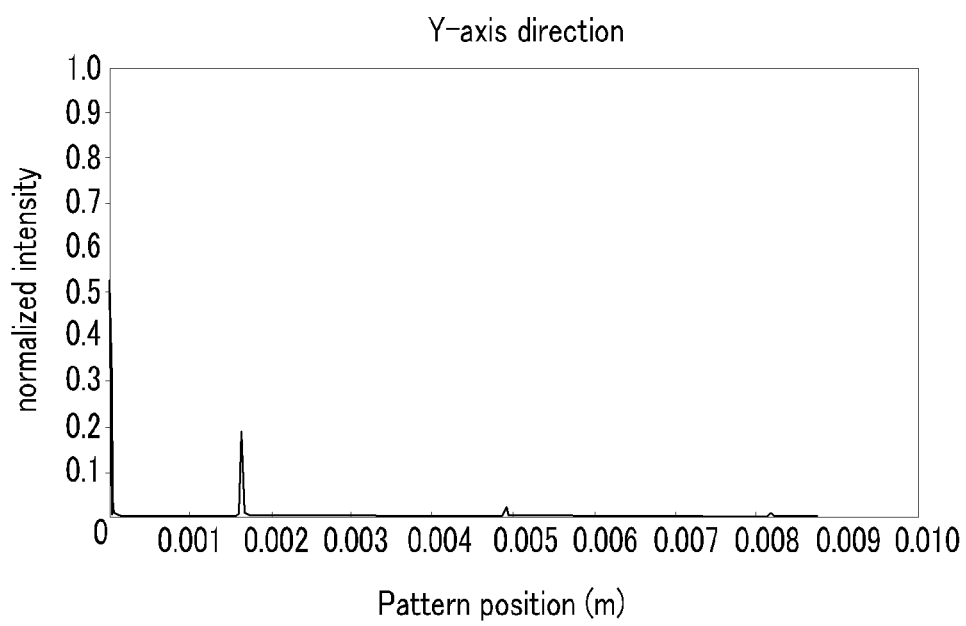

FIGS. 8 and 9 are graphs showing the positions of occurrences of a pattern caused by light diffraction in the exemplary embodiment of FIG. 1. FIG. 8 is a graph showing diffraction along the x-axis direction, and FIG. 9 is a graph showing diffraction along the y-axis direction.

In the organic light emitting diode display 101 according to the exemplary embodiment of FIG. 1, a transparent region TW is formed in a rectangular shape that is longitudinally formed in the x-axis direction.

As shown in FIGS. 8 and 9, it can be seen that almost no light diffraction occurs in the x-axis direction but occurs more or less in the y-axis direction only. It can be seen that, overall, very little light diffraction occurs.

Figure 10:
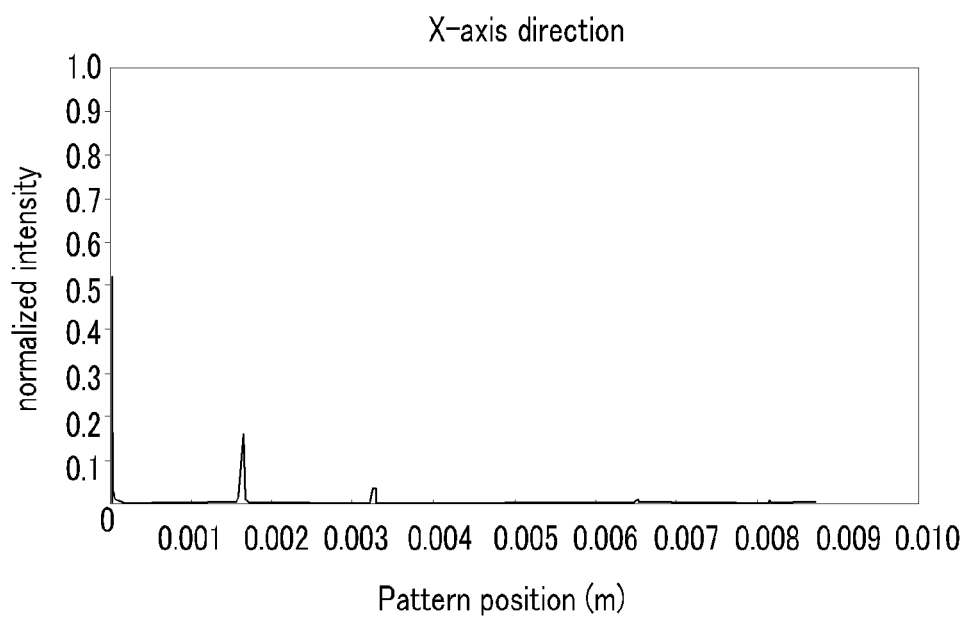
FIGS. 10 to 11 are graphs showing light diffraction experimental results with respect to the exemplary embodiment of FIG. 4.
Figure 11:
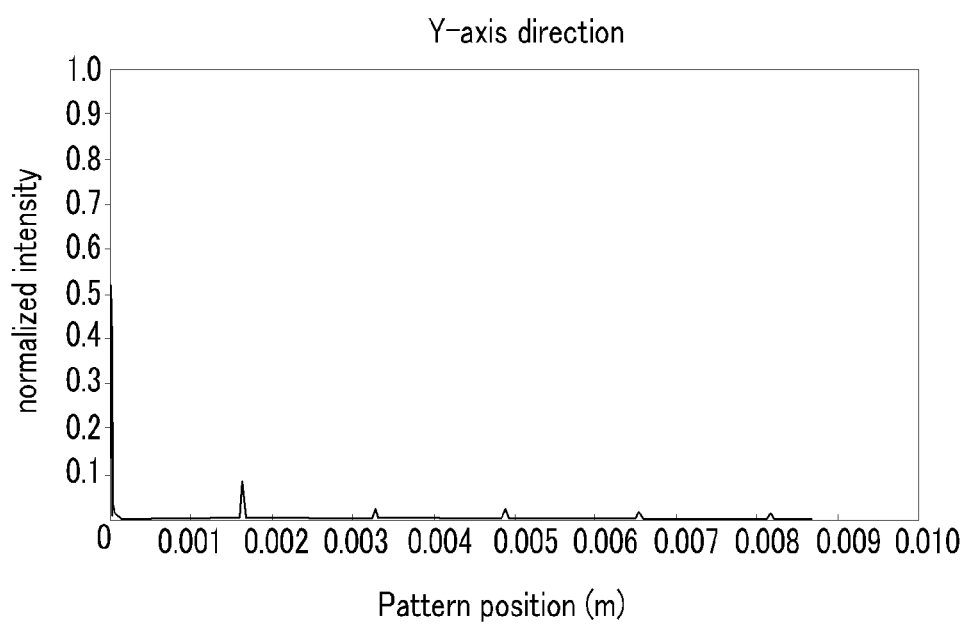

FIGS. 10 and 11 are graphs showing light diffraction in the organic light emitting diode display 102 according to the exemplary embodiment of FIG. 4. FIG. 10 is a graph showing diffraction along the x-axis direction, and FIG. 11 is a graph showing diffraction along the y-axis direction.

In the organic light emitting diode display 102 according to the exemplary embodiment of FIG. 4, a transparent region TW is formed in a stepwise shape. That is, the transparent region TW has portions that are longitudinally formed in the x-axis and y-axis directions, respectively, with respect to a given transparent square space RS. However, the two portions have different areas from each other.

As shown in FIGS. 10 and 11, it can be seen that light is more or less diffracted similarly in the x-axis direction and the y-axis direction. Moreover, it can be seen that diffraction distribution differs more or less according to the axis direction. It can be seen that, overall, very little light diffraction occurs.

Figure 12:
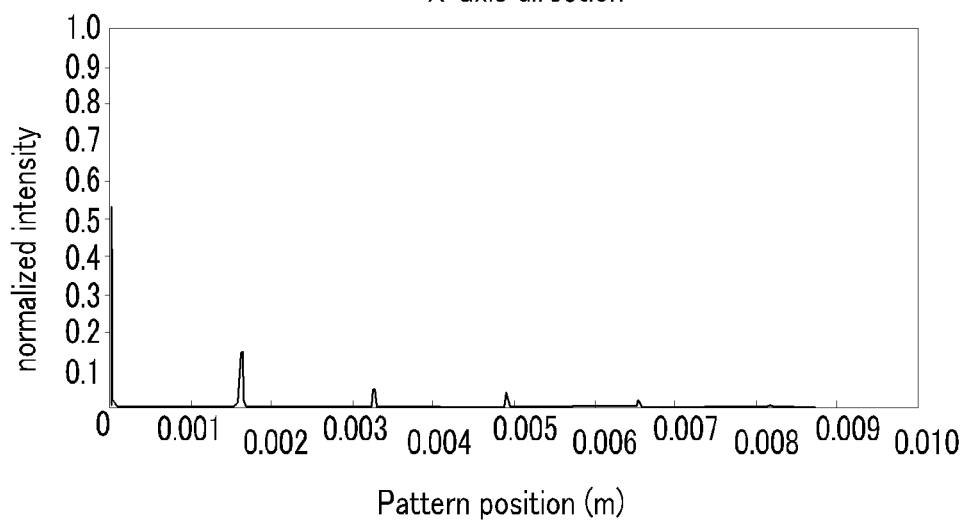
FIGS. 12 to 13 are graphs showing light diffraction experimental results with respect to the exemplary embodiment of FIG. 5.
Figure 13:
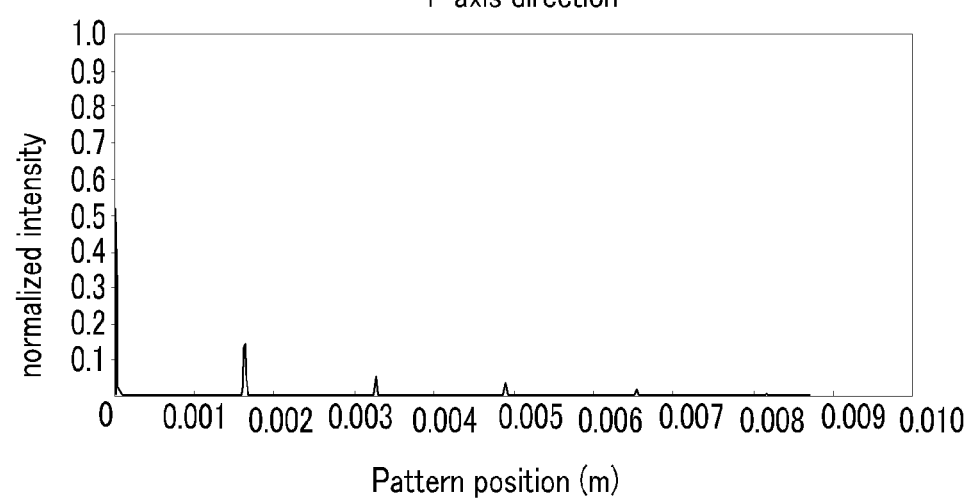

FIGS. 12 and 13 are graphs showing light diffraction in the organic light emitting diode display 103 according to the exemplary embodiment of FIG. 5. FIG. 12 is a graph showing diffraction along the x-axis direction, and FIG. 13 is a graph showing diffraction along the y-axis direction.

In the organic light emitting diode display 103 according to the exemplary embodiment of FIG. 5, a transparent region TW is formed in a stepwise shape. That is, the transparent region TW has portions that are longitudinally formed in the x-axis and y-axis directions, respectively, with respect to a given transparent square space RS. The two portions have almost the same area.

As shown in FIGS. 12 and 13, it can be seen that light is diffracted more or less equally in the x-axis direction and the y-axis direction. Moreover, it can be seen that diffraction distribution along both axis directions is almost the same. It can be seen that, overall, very little light diffraction occurs.

Figure 14:
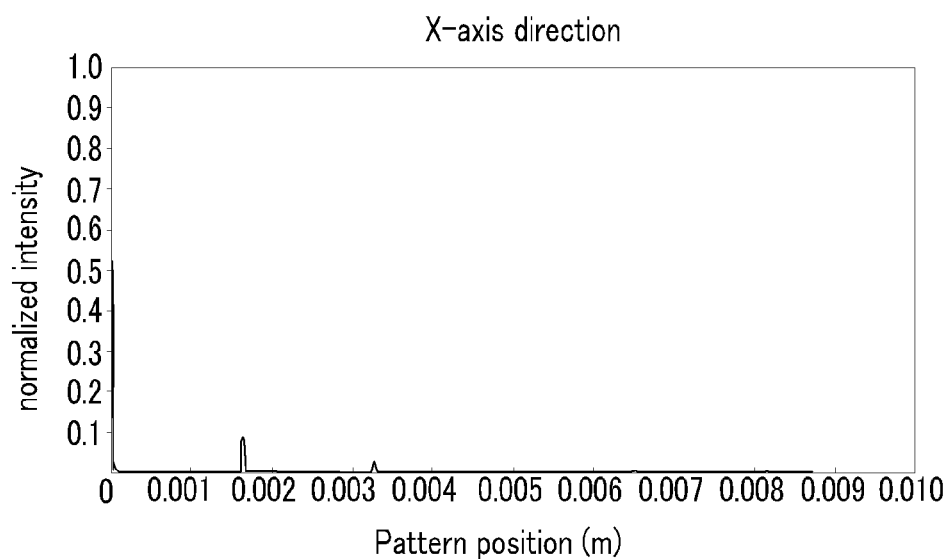
FIGS. 14 to 15 are graphs showing light diffraction experimental results with respect to the exemplary embodiment of FIG. 6.
Figure 15:
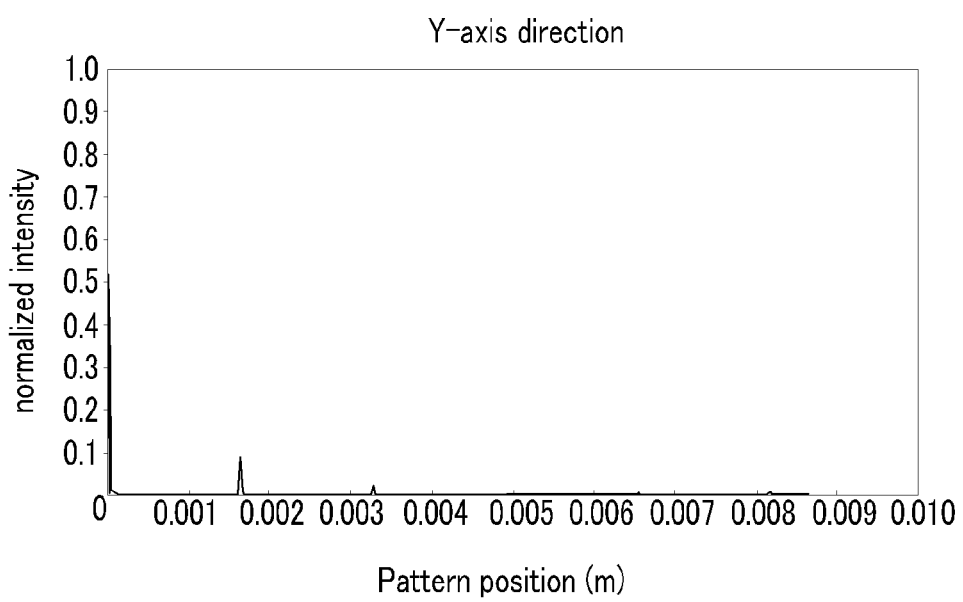

FIGS. 14 and 15 are graphs showing light diffraction in the organic light emitting diode display 104 according to the exemplary embodiment of FIG. 6. FIG. 14 is a graph showing diffraction along the x-axis direction, and FIG. 15 is a graph showing diffraction along the y-axis direction.

In the organic light emitting diode display 102 according to the exemplary embodiment of FIG. 6, a given transparent square space RS of a transparent region TW occupies most of the transparent region TW.

As shown in FIGS. 14 and 15, it can be seen that light is diffracted almost equally in the x-axis direction and in the y-axis direction. Moreover, it can be seen that diffraction distribution along both the axis directions is almost the same. It can be seen that, overall, almost no light diffraction occurs.

Figure 16:
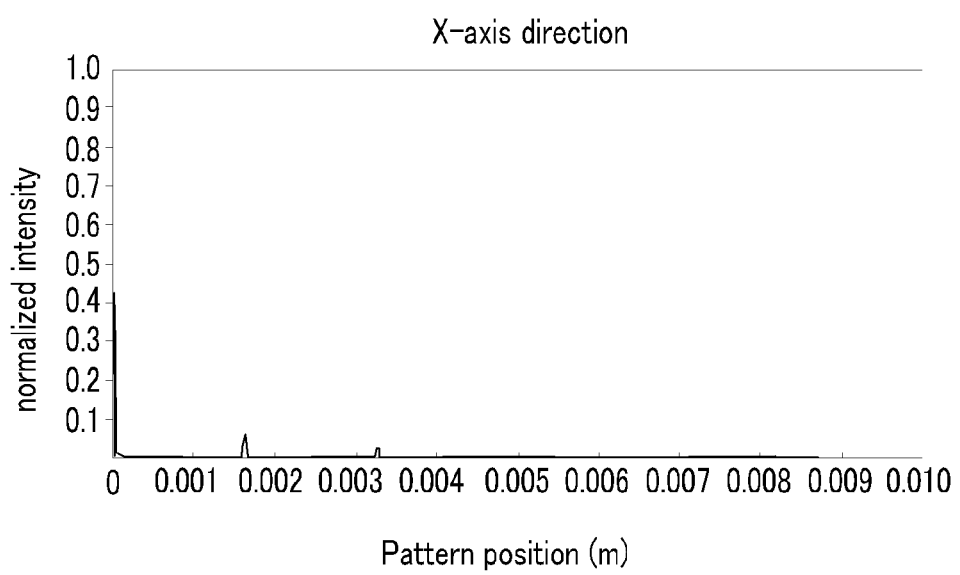
FIGS. 16 to 17 are graphs showing light diffraction experimental results with respect to the exemplary embodiment of FIG. 7.
Figure 17:
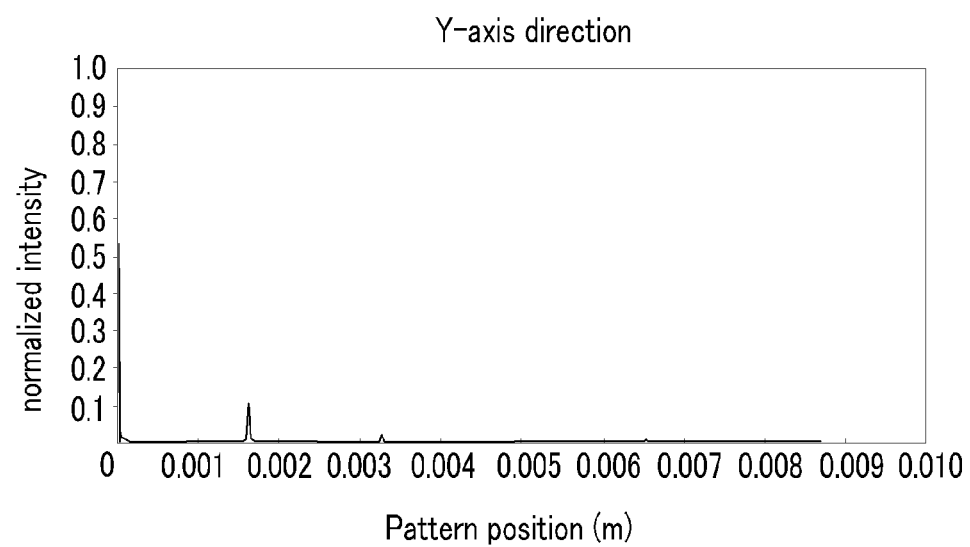

FIGS. 16 and 17 are graphs showing light diffraction in the organic light emitting diode display 105 according to the exemplary embodiment of FIG. 7. FIG. 16 is a graph showing diffraction along the x-axis direction, and FIG. 17 is a graph showing diffraction along the y-axis direction.

In Experimental Example 5, as shown above in FIG. 7, a transparent region TW and a given transparent square space RS are formed almost equally.

As shown in FIGS. 16 and 17 it can be seen that light is more or less diffracted equally in the x-axis direction and in the y-axis direction. Moreover, it can be seen that diffraction distribution along both axis directions is almost the same. It can be seen that, overall, the least light diffraction occurs.

From these experiment results, it can be concluded that the organic light emitting diode displays 101, 102, 103, 104, and 105 can minimize the distortion of an image by suppressing the diffraction of light passing through the organic light emitting diode display.

Although a few embodiments of the present invention have been shown and described, it would be appreciated by those skilled in the art that changes may be made in this embodi-

What is claimed is:

1. An organic light emitting diode display comprising:
   a substrate main body having a plurality of pixel regions, each pixel region including an opaque region and a transparent region; and
   organic light emitting diodes, thin film transistors, and conductive lines that are formed in the opaque region of each pixel region of the substrate main body,
   wherein, with respect to each pixel region, the transparent region includes a transparent square space that has an area that is at least 15% of the entire area of the pixel region.

2. The organic light emitting diode display of claim 1, wherein the transparent region further comprises an auxiliary transparent space extending in one or more directions from the transparent square space.

3. The organic light emitting diode display of claim 1, wherein the pixel region has a segment in which the width of the transparent region is larger than the width of the opaque region.

4. The organic light emitting diode display of claim 1, wherein the ratio of the area of the transparent region to the entire area of the pixel region falls in the range of 25% to 80%.

5. The organic light emitting diode display of claim 1, wherein the transparent region has an average overall transmittance of light in the range of 15% to 90%.

6. The organic light emitting diode display of claim 5, further comprising one or more transparent insulating films formed in the transparent region.

7. The organic light emitting diode display of claim 6, further comprising an opaque material formed in a part of the transparent region.

8. The organic light emitting diode display of claim 1, wherein the pixel region is formed in a square shape.

9. The organic light emitting diode display of claim 1, wherein the opaque region comprises a plurality of sub-pixel regions and a line region.

10. The organic light emitting diode display of claim 9, wherein
   the organic light emitting diodes and the thin film transistors are formed in the plurality of sub-pixel regions, and
   the conductive lines are formed in the line region.

11. The organic light emitting diode display of claim 10, wherein the conductive lines comprise a gate line, a data line, and a common power line.

12. The organic light emitting diode display of claim 9, wherein at least some of the plurality of sub-pixel regions have different areas from each other.

13. The organic light emitting diode display of claim 9, wherein the plurality of sub-pixel regions comprise a first sub-pixel region, a second sub-pixel region, and a third sub-pixel region.

14. The organic light emitting diode display of claim 13, wherein:
   the first sub-pixel region includes an organic light-emitting diode that emits red-based light,
   the second sub-pixel region includes an organic light-emitting diode that emits green-based light, and
   the third sub-pixel region includes an organic light-emitting diode that emits blue-based light.

15. The organic light emitting diode display of claim 13, wherein
   the transparent region is formed in a rectangular shape, and
   the plurality of sub-pixel regions are arranged side by side along the longest side in a lengthwise direction of the transparent region.

16. The organic light emitting diode display of claim 13, wherein
   the second sub-pixel region is arranged adjacent to one side of the first sub-pixel region, and
   the third sub-pixel region is arranged adjacent to another side of the first sub-pixel region that is perpendicular to the one side of the first sub-pixel region that the second sub-pixel region is adjacent to.

17. The organic light emitting diode display of claim 16, wherein the plurality of sub-pixel regions are formed in a square shape.

18. The organic light emitting diode display of claim 17, wherein the second sub-pixel region and the third sub-pixel region each have a pair of sides that face the transparent region and are perpendicular to each other.

19. The organic light emitting diode display of claim 16, wherein the plurality of sub-pixel regions are formed in a rectangular shape.

20. The organic light emitting diode display of claim 19, wherein
   one long side of the second sub-pixel region faces one long side of the first sub-pixel region, and one short side of the third sub-pixel region faces one short side of the first sub-pixel region,
   wherein the second sub-pixel region and the third sub-pixel region each have a pair of sides that face the transparent region and are perpendicular to each other.

21. The organic light emitting diode display of claim 19, wherein
   one short side of the second sub-pixel region faces one short side of the first sub-pixel region and one short side of the third sub-pixel region faces one long side of the first sub-pixel region, and
   one long side of the second sub-pixel region, one long side of the third sub-pixel region, and a part of the one long side of the first sub-pixel region face the transparent region.

22. The organic light emitting diode display of claim 21, wherein the transparent region is formed in a quadrangular shape.

23. The organic light emitting diode display of claim 16, wherein the first sub-pixel region is formed in a square shape, and the second sub-pixel region and the third sub-pixel region are formed in a rectangular shape.

24. The organic light emitting diode display of claim 23, wherein
   one short side of the second sub-pixel region and one short side of the third sub-pixel face the first sub-pixel region, and
   one long side of the second sub-pixel region and one long side of the third sub-pixel region face the transparent region.

25. The organic light emitting diode display of claim 24, wherein one short side of the second sub-pixel region and one short side of the third sub-pixel are shorter than one side of the first sub-pixel region.

* * * * *